(12) United States Patent
Bennett

(10) Patent No.: US 8,902,529 B1
(45) Date of Patent: Dec. 2, 2014

(54) DUAL FREQUENCY CRYSTAL OSCILLATOR

(71) Applicant: Western Digital Technologies, Inc., Irvine, CA (US)

(72) Inventor: George J. Bennett, Murrieta, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/682,686

(22) Filed: Nov. 20, 2012

(51) Int. Cl.
| | |
|---|---|
| *G11B 5/09* | (2006.01) |
| *H03L 7/24* | (2006.01) |
| *H03B 1/00* | (2006.01) |
| *G11B 20/10* | (2006.01) |

(52) U.S. Cl.
CPC .............. *H03B 1/00* (2013.01); *G11B 20/1024* (2013.01)
USPC .............................................. 360/51; 331/47

(58) Field of Classification Search
None
See application file for complete search history.

(56) References Cited

U.S. PATENT DOCUMENTS

| | | | |
|---|---|---|---|
| 4,859,969 A | 8/1989 | Malinowski et al. |
| 5,041,754 A | 8/1991 | Smythe |
| 5,512,864 A | 4/1996 | Vig |
| 6,018,789 A | 1/2000 | Sokolov et al. |
| 6,065,095 A | 5/2000 | Sokolov et al. |
| 6,078,452 A | 6/2000 | Kittilson et al. |
| 6,081,447 A | 6/2000 | Lofgren et al. |
| 6,092,149 A | 7/2000 | Hicken et al. |
| 6,092,150 A | 7/2000 | Sokolov et al. |
| 6,094,707 A | 7/2000 | Sokolov et al. |
| 6,105,104 A | 8/2000 | Guttmann et al. |
| 6,111,717 A | 8/2000 | Cloke et al. |
| 6,145,052 A | 11/2000 | Howe et al. |
| 6,175,893 B1 | 1/2001 | D'Souza et al. |
| 6,178,056 B1 | 1/2001 | Cloke et al. |
| 6,191,909 B1 | 2/2001 | Cloke et al. |
| 6,195,218 B1 | 2/2001 | Guttmann et al. |
| 6,205,494 B1 | 3/2001 | Williams |
| 6,208,477 B1 | 3/2001 | Cloke et al. |
| 6,223,303 B1 | 4/2001 | Billings et al. |
| 6,230,233 B1 | 5/2001 | Lofgren et al. |
| 6,246,346 B1 | 6/2001 | Cloke et al. |
| 6,249,393 B1 | 6/2001 | Billings et al. |
| 6,256,695 B1 | 7/2001 | Williams |
| 6,262,857 B1 | 7/2001 | Hull et al. |
| 6,263,459 B1 | 7/2001 | Schibilla |
| 6,272,694 B1 | 8/2001 | Weaver et al. |
| 6,278,568 B1 | 8/2001 | Cloke et al. |
| 6,279,089 B1 | 8/2001 | Schibilla et al. |
| 6,289,484 B1 | 9/2001 | Rothberg et al. |
| 6,292,912 B1 | 9/2001 | Cloke et al. |
| 6,310,740 B1 | 10/2001 | Dunbar et al. |
| 6,317,850 B1 | 11/2001 | Rothberg |
| 6,327,106 B1 | 12/2001 | Rothberg |
| 6,337,778 B1 | 1/2002 | Gagne |
| 6,341,048 B1 | 1/2002 | Morris et al. |
| 6,369,969 B1 | 4/2002 | Christiansen et al. |
| 6,384,999 B1 | 5/2002 | Schibilla |
| 6,388,833 B1 | 5/2002 | Golowka et al. |
| 6,405,342 B1 | 6/2002 | Lee |

(Continued)

*Primary Examiner* — Regina N Holder

(57) ABSTRACT

An oscillator is disclosed comprising a first crystal operable to generate a first oscillating signal at a first frequency, and a second crystal coupled to the first crystal and operable to generate a second oscillating signal at a second frequency higher than the first frequency. The oscillator further comprises a DC restore circuit operable to generate a third oscillating signal comprising a substantially fifty percent duty cycle in response to the second oscillating signal.

22 Claims, 7 Drawing Sheets

(56) References Cited

U.S. PATENT DOCUMENTS

| | | |
|---|---|---|
| 6,408,357 B1 | 6/2002 | Hanmann et al. |
| 6,408,406 B1 | 6/2002 | Parris |
| 6,411,452 B1 | 6/2002 | Cloke |
| 6,411,458 B1 | 6/2002 | Billings et al. |
| 6,412,083 B1 | 6/2002 | Rothberg et al. |
| 6,415,349 B1 | 7/2002 | Hull et al. |
| 6,425,128 B1 | 7/2002 | Krapf et al. |
| 6,441,981 B1 | 8/2002 | Cloke et al. |
| 6,442,328 B1 | 8/2002 | Elliott et al. |
| 6,445,524 B1 | 9/2002 | Nazarian et al. |
| 6,449,767 B1 | 9/2002 | Krapf et al. |
| 6,453,115 B1 | 9/2002 | Boyle |
| 6,470,420 B1 | 10/2002 | Hospodor |
| 6,480,020 B1 | 11/2002 | Jung et al. |
| 6,480,349 B1 | 11/2002 | Kim et al. |
| 6,480,932 B1 | 11/2002 | Vallis et al. |
| 6,483,986 B1 | 11/2002 | Krapf |
| 6,487,032 B1 | 11/2002 | Cloke et al. |
| 6,490,635 B1 | 12/2002 | Holmes |
| 6,493,173 B1 | 12/2002 | Kim et al. |
| 6,499,083 B1 | 12/2002 | Hamlin |
| 6,519,104 B1 | 2/2003 | Cloke et al. |
| 6,525,892 B1 | 2/2003 | Dunbar et al. |
| 6,545,830 B1 | 4/2003 | Briggs et al. |
| 6,546,489 B1 | 4/2003 | Frank, Jr. et al. |
| 6,549,083 B2 | 4/2003 | Kanazawa et al. |
| 6,550,021 B1 | 4/2003 | Dalphy et al. |
| 6,552,880 B1 | 4/2003 | Dunbar et al. |
| 6,553,457 B1 | 4/2003 | Wilkins et al. |
| 6,578,106 B1 | 6/2003 | Price |
| 6,580,573 B1 | 6/2003 | Hull et al. |
| 6,594,183 B1 | 7/2003 | Lofgren et al. |
| 6,600,620 B1 | 7/2003 | Krounbi et al. |
| 6,601,137 B1 | 7/2003 | Castro et al. |
| 6,603,622 B1 | 8/2003 | Christiansen et al. |
| 6,603,625 B1 | 8/2003 | Hospodor et al. |
| 6,604,220 B1 | 8/2003 | Lee |
| 6,606,682 B1 | 8/2003 | Dang et al. |
| 6,606,714 B1 | 8/2003 | Thelin |
| 6,606,717 B1 | 8/2003 | Yu et al. |
| 6,611,393 B1 | 8/2003 | Nguyen et al. |
| 6,615,312 B1 | 9/2003 | Hamlin et al. |
| 6,639,748 B1 | 10/2003 | Christiansen et al. |
| 6,647,481 B1 | 11/2003 | Luu et al. |
| 6,654,193 B1 | 11/2003 | Thelin |
| 6,657,810 B1 | 12/2003 | Kupferman |
| 6,661,591 B1 | 12/2003 | Rothberg |
| 6,665,772 B1 | 12/2003 | Hamlin |
| 6,687,073 B1 | 2/2004 | Kupferman |
| 6,687,078 B1 | 2/2004 | Kim |
| 6,687,850 B1 | 2/2004 | Rothberg |
| 6,690,523 B1 | 2/2004 | Nguyen et al. |
| 6,690,882 B1 | 2/2004 | Hanmann et al. |
| 6,691,198 B1 | 2/2004 | Hamlin |
| 6,691,213 B1 | 2/2004 | Luu et al. |
| 6,691,255 B1 | 2/2004 | Rothberg et al. |
| 6,693,760 B1 | 2/2004 | Krounbi et al. |
| 6,694,477 B1 | 2/2004 | Lee |
| 6,697,914 B1 | 2/2004 | Hospodor et al. |
| 6,704,153 B1 | 3/2004 | Rothberg et al. |
| 6,708,251 B1 | 3/2004 | Boyle et al. |
| 6,710,951 B1 | 3/2004 | Cloke |
| 6,711,628 B1 | 3/2004 | Thelin |
| 6,711,635 B1 | 3/2004 | Wang |
| 6,711,660 B1 | 3/2004 | Milne et al. |
| 6,715,044 B2 | 3/2004 | Lofgren et al. |
| 6,724,982 B1 | 4/2004 | Hamlin |
| 6,725,329 B1 | 4/2004 | Ng et al. |
| 6,735,650 B1 | 5/2004 | Rothberg |
| 6,735,693 B1 | 5/2004 | Hamlin |
| 6,744,772 B1 | 6/2004 | Eneboe et al. |
| 6,745,283 B1 | 6/2004 | Dang |
| 6,751,402 B1 | 6/2004 | Elliott et al. |
| 6,757,481 B1 | 6/2004 | Nazarian et al. |
| 6,772,281 B2 | 8/2004 | Hamlin |
| 6,781,826 B1 | 8/2004 | Goldstone et al. |
| 6,782,449 B1 | 8/2004 | Codilian et al. |
| 6,791,779 B1 | 9/2004 | Singh et al. |
| 6,792,486 B1 | 9/2004 | Hanan et al. |
| 6,799,274 B1 | 9/2004 | Hamlin |
| 6,811,427 B2 | 11/2004 | Garrett et al. |
| 6,826,003 B1 | 11/2004 | Subrahmanyam |
| 6,826,614 B1 | 11/2004 | Hanmann et al. |
| 6,832,041 B1 | 12/2004 | Boyle |
| 6,832,929 B2 | 12/2004 | Garrett et al. |
| 6,845,405 B1 | 1/2005 | Thelin |
| 6,845,427 B1 | 1/2005 | Atai-Azimi |
| 6,850,384 B1* | 2/2005 | Bennett ........................ 360/75 |
| 6,850,443 B2 | 2/2005 | Lofgren et al. |
| 6,851,055 B1 | 2/2005 | Boyle et al. |
| 6,851,063 B1 | 2/2005 | Boyle et al. |
| 6,853,731 B1 | 2/2005 | Boyle et al. |
| 6,854,022 B1 | 2/2005 | Thelin |
| 6,862,660 B1 | 3/2005 | Wilkins et al. |
| 6,880,043 B1 | 4/2005 | Castro et al. |
| 6,882,486 B1 | 4/2005 | Kupferman |
| 6,884,085 B1 | 4/2005 | Goldstone |
| 6,888,831 B1 | 5/2005 | Hospodor et al. |
| 6,892,217 B1 | 5/2005 | Hanmann et al. |
| 6,892,249 B1 | 5/2005 | Codilian et al. |
| 6,892,313 B1 | 5/2005 | Codilian et al. |
| 6,895,455 B1 | 5/2005 | Rothberg |
| 6,895,500 B1 | 5/2005 | Rothberg |
| 6,898,730 B1 | 5/2005 | Hanan |
| 6,910,099 B1 | 6/2005 | Wang et al. |
| 6,928,470 B1 | 8/2005 | Hamlin |
| 6,931,439 B1 | 8/2005 | Hanmann et al. |
| 6,934,104 B1 | 8/2005 | Kupferman |
| 6,934,713 B2 | 8/2005 | Schwartz et al. |
| 6,940,873 B2 | 9/2005 | Boyle et al. |
| 6,943,978 B1 | 9/2005 | Lee |
| 6,948,165 B1 | 9/2005 | Luu et al. |
| 6,950,267 B1 | 9/2005 | Liu et al. |
| 6,954,733 B1 | 10/2005 | Ellis et al. |
| 6,961,814 B1 | 11/2005 | Thelin et al. |
| 6,965,489 B1 | 11/2005 | Lee et al. |
| 6,965,563 B1 | 11/2005 | Hospodor et al. |
| 6,965,966 B1 | 11/2005 | Rothberg et al. |
| 6,967,799 B1 | 11/2005 | Lee |
| 6,968,422 B1 | 11/2005 | Codilian et al. |
| 6,968,450 B1 | 11/2005 | Rothberg et al. |
| 6,973,495 B1 | 12/2005 | Milne et al. |
| 6,973,570 B1 | 12/2005 | Hamlin |
| 6,976,190 B1 | 12/2005 | Goldstone |
| 6,983,316 B1 | 1/2006 | Milne et al. |
| 6,986,007 B1 | 1/2006 | Procyk et al. |
| 6,986,154 B1 | 1/2006 | Price et al. |
| 6,995,933 B1 | 2/2006 | Codilian et al. |
| 6,996,501 B1 | 2/2006 | Rothberg |
| 6,996,669 B1 | 2/2006 | Dang et al. |
| 7,002,926 B1 | 2/2006 | Eneboe et al. |
| 7,003,674 B1 | 2/2006 | Hamlin |
| 7,006,316 B1 | 2/2006 | Sargenti, Jr. et al. |
| 7,009,820 B1 | 3/2006 | Hogg |
| 7,023,639 B1 | 4/2006 | Kupferman |
| 7,024,491 B1 | 4/2006 | Hanmann et al. |
| 7,024,549 B1 | 4/2006 | Luu et al. |
| 7,024,614 B1 | 4/2006 | Thelin et al. |
| 7,027,716 B1 | 4/2006 | Boyle et al. |
| 7,028,174 B1 | 4/2006 | Atai-Azimi et al. |
| 7,031,902 B1 | 4/2006 | Catiller |
| 7,046,465 B1 | 5/2006 | Kupferman |
| 7,046,488 B1 | 5/2006 | Hogg |
| 7,050,252 B1 | 5/2006 | Vallis |
| 7,054,937 B1 | 5/2006 | Milne et al. |
| 7,055,000 B1 | 5/2006 | Severtson |
| 7,055,167 B1 | 5/2006 | Masters |
| 7,057,836 B1 | 6/2006 | Kupferman |
| 7,062,398 B1 | 6/2006 | Rothberg |
| 7,075,746 B1 | 7/2006 | Kupferman |
| 7,076,604 B1 | 7/2006 | Thelin |
| 7,082,494 B1 | 7/2006 | Thelin et al. |
| 7,088,538 B1 | 8/2006 | Codilian et al. |
| 7,088,545 B1 | 8/2006 | Singh et al. |

(56) References Cited

U.S. PATENT DOCUMENTS

| | | | |
|---|---|---|---|
| 7,092,186 | B1 | 8/2006 | Hogg |
| 7,095,577 | B1 | 8/2006 | Codilian et al. |
| 7,099,095 | B1 | 8/2006 | Subrahmanyam et al. |
| 7,106,537 | B1 | 9/2006 | Bennett |
| 7,106,947 | B2 | 9/2006 | Boyle et al. |
| 7,110,202 | B1 | 9/2006 | Vasquez |
| 7,111,116 | B1 | 9/2006 | Boyle et al. |
| 7,114,029 | B1 | 9/2006 | Thelin |
| 7,120,737 | B1 | 10/2006 | Thelin |
| 7,120,806 | B1 | 10/2006 | Codilian et al. |
| 7,126,776 | B1 | 10/2006 | Warren, Jr. et al. |
| 7,129,763 | B1 | 10/2006 | Bennett et al. |
| 7,133,600 | B1 | 11/2006 | Boyle |
| 7,136,244 | B1 | 11/2006 | Rothberg |
| 7,146,094 | B1 | 12/2006 | Boyle |
| 7,149,046 | B1 | 12/2006 | Coker et al. |
| 7,150,036 | B1 | 12/2006 | Milne et al. |
| 7,155,616 | B1 | 12/2006 | Hamlin |
| 7,171,108 | B1 | 1/2007 | Masters et al. |
| 7,171,110 | B1 | 1/2007 | Wilshire |
| 7,194,576 | B1 | 3/2007 | Boyle |
| 7,200,698 | B1 | 4/2007 | Rothberg |
| 7,205,805 | B1 | 4/2007 | Bennett |
| 7,206,497 | B1 | 4/2007 | Boyle et al. |
| 7,215,496 | B1 | 5/2007 | Kupferman et al. |
| 7,215,771 | B1 | 5/2007 | Hamlin |
| 7,237,054 | B1 | 6/2007 | Cain et al. |
| 7,240,161 | B1 | 7/2007 | Boyle |
| 7,249,365 | B1 | 7/2007 | Price et al. |
| 7,259,636 | B2 | 8/2007 | Oita |
| 7,263,709 | B1 | 8/2007 | Krapf |
| 7,274,639 | B1 | 9/2007 | Codilian et al. |
| 7,274,659 | B2 | 9/2007 | Hospodor |
| 7,275,116 | B1 | 9/2007 | Hanmann et al. |
| 7,280,302 | B1 | 10/2007 | Masiewicz |
| 7,292,774 | B1 | 11/2007 | Masters et al. |
| 7,292,775 | B1 | 11/2007 | Boyle et al. |
| 7,296,284 | B1 | 11/2007 | Price et al. |
| 7,302,501 | B1 | 11/2007 | Cain et al. |
| 7,302,579 | B1 | 11/2007 | Cain et al. |
| 7,318,088 | B1 | 1/2008 | Mann |
| 7,319,806 | B1 | 1/2008 | Willner et al. |
| 7,325,244 | B2 | 1/2008 | Boyle et al. |
| 7,330,323 | B1 | 2/2008 | Singh et al. |
| 7,346,790 | B1 | 3/2008 | Klein |
| 7,366,641 | B1 | 4/2008 | Masiewicz et al. |
| 7,369,340 | B1 | 5/2008 | Dang et al. |
| 7,369,343 | B1 | 5/2008 | Yeo et al. |
| 7,372,650 | B1 | 5/2008 | Kupferman |
| 7,380,147 | B1 | 5/2008 | Sun |
| 7,392,340 | B1 | 6/2008 | Dang et al. |
| 7,404,013 | B1 | 7/2008 | Masiewicz |
| 7,406,545 | B1 | 7/2008 | Rothberg et al. |
| 7,415,571 | B1 | 8/2008 | Hanan |
| 7,436,610 | B1 | 10/2008 | Thelin |
| 7,437,502 | B1 | 10/2008 | Coker |
| 7,440,214 | B1 | 10/2008 | Ell et al. |
| 7,451,344 | B1 | 11/2008 | Rothberg |
| 7,471,483 | B1 | 12/2008 | Ferris et al. |
| 7,471,486 | B1 | 12/2008 | Coker et al. |
| 7,486,060 | B1 | 2/2009 | Bennett |
| 7,496,493 | B1 | 2/2009 | Stevens |
| 7,518,819 | B1 | 4/2009 | Yu et al. |
| 7,526,184 | B1 | 4/2009 | Parkinen et al. |
| 7,539,924 | B1 | 5/2009 | Vasquez et al. |
| 7,543,117 | B1 | 6/2009 | Hanan |
| 7,551,383 | B1 | 6/2009 | Kupferman |
| 7,561,091 | B1 | 7/2009 | Muenter et al. |
| 7,562,282 | B1 | 7/2009 | Rothberg |
| 7,577,973 | B1 | 8/2009 | Kapner, III et al. |
| 7,596,797 | B1 | 9/2009 | Kapner, III et al. |
| 7,599,139 | B1 | 10/2009 | Bombet et al. |
| 7,619,841 | B1 | 11/2009 | Kupferman |
| 7,647,544 | B1 | 1/2010 | Masiewicz |
| 7,649,704 | B1 | 1/2010 | Bombet et al. |
| 7,653,927 | B1 | 1/2010 | Kapner, III et al. |
| 7,656,603 | B1 | 2/2010 | Xing |
| 7,656,763 | B1 | 2/2010 | Jin et al. |
| 7,657,149 | B2 | 2/2010 | Boyle |
| 7,672,072 | B1 | 3/2010 | Boyle et al. |
| 7,673,075 | B1 | 3/2010 | Masiewicz |
| 7,688,540 | B1 | 3/2010 | Mei et al. |
| 7,724,461 | B1 | 5/2010 | McFadyen et al. |
| 7,725,584 | B1 | 5/2010 | Hanmann et al. |
| 7,730,295 | B1 | 6/2010 | Lee |
| 7,733,189 | B1 * | 6/2010 | Bennett ............... 331/64 |
| 7,760,458 | B1 | 7/2010 | Trinh |
| 7,768,776 | B1 | 8/2010 | Szeremeta et al. |
| 7,804,657 | B1 | 9/2010 | Hogg et al. |
| 7,813,954 | B1 | 10/2010 | Price et al. |
| 7,827,320 | B1 | 11/2010 | Stevens |
| 7,839,588 | B1 | 11/2010 | Dang et al. |
| 7,843,660 | B1 | 11/2010 | Yeo |
| 7,852,596 | B2 | 12/2010 | Boyle et al. |
| 7,859,782 | B1 | 12/2010 | Lee |
| 7,872,822 | B1 | 1/2011 | Rothberg |
| 7,898,756 | B1 | 3/2011 | Wang |
| 7,898,762 | B1 | 3/2011 | Guo et al. |
| 7,900,037 | B1 | 3/2011 | Fallone et al. |
| 7,907,364 | B2 | 3/2011 | Boyle et al. |
| 7,929,234 | B1 | 4/2011 | Boyle et al. |
| 7,933,087 | B1 | 4/2011 | Tsai et al. |
| 7,933,090 | B1 | 4/2011 | Jung et al. |
| 7,934,030 | B1 | 4/2011 | Sargenti, Jr. et al. |
| 7,940,491 | B2 | 5/2011 | Szeremeta et al. |
| 7,944,639 | B1 | 5/2011 | Wang |
| 7,945,727 | B2 | 5/2011 | Rothberg et al. |
| 7,949,564 | B1 | 5/2011 | Hughes et al. |
| 7,974,029 | B2 | 7/2011 | Tsai et al. |
| 7,974,039 | B1 | 7/2011 | Xu et al. |
| 7,982,993 | B1 | 7/2011 | Tsai et al. |
| 7,984,200 | B1 | 7/2011 | Bombet et al. |
| 7,990,648 | B1 | 8/2011 | Wang |
| 7,992,179 | B1 | 8/2011 | Kapner, III et al. |
| 8,004,785 | B1 | 8/2011 | Tsai et al. |
| 8,006,027 | B1 | 8/2011 | Stevens et al. |
| 8,014,094 | B1 | 9/2011 | Jin |
| 8,014,977 | B1 | 9/2011 | Masiewicz et al. |
| 8,019,914 | B1 | 9/2011 | Vasquez et al. |
| 8,040,625 | B1 | 10/2011 | Boyle et al. |
| 8,077,420 | B2 | 12/2011 | Tanner |
| 8,078,943 | B1 | 12/2011 | Lee |
| 8,079,045 | B2 | 12/2011 | Krapf et al. |
| 8,081,101 | B2 | 12/2011 | Daniels et al. |
| 8,082,433 | B1 | 12/2011 | Fallone et al. |
| 8,085,487 | B1 | 12/2011 | Jung et al. |
| 8,089,719 | B1 | 1/2012 | Dakroub |
| 8,090,902 | B1 | 1/2012 | Bennett et al. |
| 8,090,906 | B1 | 1/2012 | Blaha et al. |
| 8,091,112 | B1 | 1/2012 | Elliott et al. |
| 8,094,396 | B1 | 1/2012 | Zhang et al. |
| 8,094,401 | B1 | 1/2012 | Peng et al. |
| 8,116,020 | B1 | 2/2012 | Lee |
| 8,116,025 | B1 | 2/2012 | Chan et al. |
| 8,134,793 | B1 | 3/2012 | Vasquez et al. |
| 8,134,798 | B1 | 3/2012 | Thelin et al. |
| 8,139,301 | B1 | 3/2012 | Li et al. |
| 8,139,310 | B1 | 3/2012 | Hogg |
| 8,144,419 | B1 | 3/2012 | Liu |
| 8,145,452 | B1 | 3/2012 | Masiewicz et al. |
| 8,149,528 | B1 | 4/2012 | Suratman et al. |
| 8,154,812 | B1 | 4/2012 | Boyle et al. |
| 8,159,768 | B1 | 4/2012 | Miyamura |
| 8,161,328 | B1 | 4/2012 | Wilshire |
| 8,164,849 | B1 | 4/2012 | Szeremeta et al. |
| 8,174,780 | B1 | 5/2012 | Tsai et al. |
| 8,190,575 | B1 | 5/2012 | Ong et al. |
| 8,194,338 | B1 | 6/2012 | Zhang |
| 8,194,340 | B1 | 6/2012 | Boyle et al. |
| 8,194,341 | B1 | 6/2012 | Boyle |
| 8,201,066 | B1 | 6/2012 | Wang |
| 8,271,692 | B1 | 9/2012 | Dinh et al. |
| 8,279,550 | B1 | 10/2012 | Hogg |
| 8,281,218 | B1 | 10/2012 | Ybarra et al. |

(56) References Cited

U.S. PATENT DOCUMENTS

| | | |
|---|---|---|
| 8,285,923 B2 | 10/2012 | Stevens |
| 8,289,656 B1 | 10/2012 | Huber |
| 8,305,705 B1 | 11/2012 | Roohr |
| 8,307,156 B1 | 11/2012 | Codilian et al. |
| 8,310,775 B1 | 11/2012 | Boguslawski et al. |
| 8,315,006 B1 | 11/2012 | Chahwan et al. |
| 8,316,263 B1 | 11/2012 | Gough et al. |
| 8,320,067 B1 | 11/2012 | Tsai et al. |
| 8,324,974 B1 | 12/2012 | Bennett |
| 8,332,695 B2 | 12/2012 | Dalphy et al. |
| 8,341,337 B1 | 12/2012 | Ong et al. |
| 8,350,628 B1 | 1/2013 | Bennett |
| 8,356,184 B1 | 1/2013 | Meyer et al. |
| 8,370,683 B1 | 2/2013 | Ryan et al. |
| 8,375,225 B1 | 2/2013 | Ybarra |
| 8,375,274 B1 | 2/2013 | Bonke |
| 8,380,922 B1 | 2/2013 | Deforest et al. |
| 8,390,948 B2 | 3/2013 | Hogg |
| 8,390,952 B1 | 3/2013 | Szeremeta |
| 8,392,689 B1 | 3/2013 | Lott |
| 8,407,393 B1 | 3/2013 | Yolar et al. |
| 8,413,010 B1 | 4/2013 | Vasquez et al. |
| 8,417,566 B2 | 4/2013 | Price et al. |
| 8,421,663 B1 | 4/2013 | Bennett |
| 8,422,172 B1 | 4/2013 | Dakroub et al. |
| 8,427,771 B1 | 4/2013 | Tsai |
| 8,429,343 B1 | 4/2013 | Tsai |
| 8,433,937 B1 | 4/2013 | Wheelock et al. |
| 8,433,977 B1 | 4/2013 | Vasquez et al. |
| 8,458,526 B2 | 6/2013 | Dalphy et al. |
| 8,462,466 B2 | 6/2013 | Huber |
| 8,467,151 B1 | 6/2013 | Huber |
| 8,489,841 B1 | 7/2013 | Strecke et al. |
| 8,493,679 B1 | 7/2013 | Boguslawski et al. |
| 8,498,074 B1 | 7/2013 | Mobley et al. |
| 8,499,198 B1 | 7/2013 | Messenger et al. |
| 8,512,049 B1 | 8/2013 | Huber et al. |
| 8,514,506 B1 | 8/2013 | Li et al. |
| 8,531,791 B1 | 9/2013 | Reid et al. |
| 8,554,741 B1 | 10/2013 | Malina |
| 8,560,759 B1 | 10/2013 | Boyle et al. |
| 8,565,053 B1 | 10/2013 | Chung |
| 8,576,511 B1 | 11/2013 | Coker et al. |
| 8,578,100 B1 | 11/2013 | Huynh et al. |
| 8,578,242 B1 | 11/2013 | Burton et al. |
| 8,589,773 B1 | 11/2013 | Wang et al. |
| 8,593,753 B1 | 11/2013 | Anderson |
| 8,595,432 B1 | 11/2013 | Vinson et al. |
| 8,599,510 B1 | 12/2013 | Fallone |
| 8,601,248 B2 | 12/2013 | Thorsted |
| 8,611,032 B2 | 12/2013 | Champion et al. |
| 8,612,650 B1 | 12/2013 | Carrie et al. |
| 8,612,706 B1 | 12/2013 | Madril et al. |
| 8,612,798 B1 | 12/2013 | Tsai |
| 8,619,383 B1 | 12/2013 | Jung et al. |
| 8,621,115 B1 | 12/2013 | Bombet et al. |
| 8,621,133 B1 | 12/2013 | Boyle |
| 8,626,463 B2 | 1/2014 | Stevens et al. |
| 8,630,052 B1 | 1/2014 | Jung et al. |
| 8,630,056 B1 | 1/2014 | Ong |
| 8,631,188 B1 | 1/2014 | Heath et al. |
| 8,634,158 B1 | 1/2014 | Chahwan et al. |
| 8,635,412 B1 | 1/2014 | Wilshire |
| 8,640,007 B1 | 1/2014 | Schulze |
| 8,654,619 B1 | 2/2014 | Cheng |
| 8,661,193 B1 | 2/2014 | Cobos et al. |
| 8,667,248 B1 | 3/2014 | Neppalli |
| 8,670,205 B1 | 3/2014 | Malina et al. |
| 8,683,295 B1 | 3/2014 | Syu et al. |
| 8,683,457 B1 | 3/2014 | Hughes et al. |
| 8,687,306 B1 | 4/2014 | Coker et al. |
| 8,693,133 B1 | 4/2014 | Lee et al. |
| 8,694,841 B1 | 4/2014 | Chung et al. |
| 8,699,159 B1 | 4/2014 | Malina |
| 8,699,171 B1 | 4/2014 | Boyle |
| 8,699,172 B1 | 4/2014 | Gunderson et al. |
| 8,699,175 B1 | 4/2014 | Olds et al. |
| 8,699,185 B1 | 4/2014 | Teh et al. |
| 8,700,850 B1 | 4/2014 | Lalouette |
| 8,711,027 B1 | 4/2014 | Bennett |
| 8,743,502 B1 | 6/2014 | Bonke et al. |
| 8,749,910 B1 | 6/2014 | Dang et al. |
| 8,751,699 B1 | 6/2014 | Tsai et al. |
| 8,755,141 B1 | 6/2014 | Dang |
| 8,755,143 B2 | 6/2014 | Wilson et al. |
| 8,756,361 B1 | 6/2014 | Pruett et al. |
| 8,756,382 B1 | 6/2014 | Carlson et al. |
| 8,769,593 B1 | 7/2014 | Elliott et al. |
| 8,773,802 B1 | 7/2014 | Anderson et al. |
| 8,780,478 B1 | 7/2014 | Huynh et al. |
| 8,782,334 B1 | 7/2014 | Boyle et al. |
| 8,793,532 B1 | 7/2014 | Tsai et al. |
| 8,797,669 B1 | 8/2014 | Burton et al. |
| 8,799,977 B1 | 8/2014 | Kapner, III et al. |
| 2006/0071756 A1* | 4/2006 | Steeves ............. 340/10.1 |
| 2007/0074077 A1 | 3/2007 | Markow et al. |
| 2009/0113702 A1 | 5/2009 | Hogg |
| 2010/0306551 A1 | 12/2010 | Meyer et al. |
| 2011/0226729 A1 | 9/2011 | Hogg |
| 2012/0159042 A1 | 6/2012 | Lott et al. |
| 2012/0242419 A1* | 9/2012 | Tsai et al. ............. 331/109 |
| 2012/0275050 A1 | 11/2012 | Wilson et al. |
| 2012/0281963 A1 | 11/2012 | Krapf et al. |
| 2012/0324980 A1 | 12/2012 | Nguyen et al. |
| 2013/0038397 A1* | 2/2013 | Kobayashi ............. 331/46 |

* cited by examiner

DUAL FREQUENCY CRYSTAL OSCILLATOR

BACKGROUND

Crystal oscillators are commonly used to generate a clock signal at a very stable, precise frequency. The clock signal may be used to drive the control circuitry in a number of electronic devices, such as computing devices (e.g., desktops, laptops, tablets, disk drives, etc.) and consumer devices (e.g., cell phones, music players, video players, game players, televisions, etc.). It is desirable to improve on prior art crystal oscillators to achieve increased performance for the electronic devices in which they are employed.

DETAILED DESCRIPTION

Figure 1:
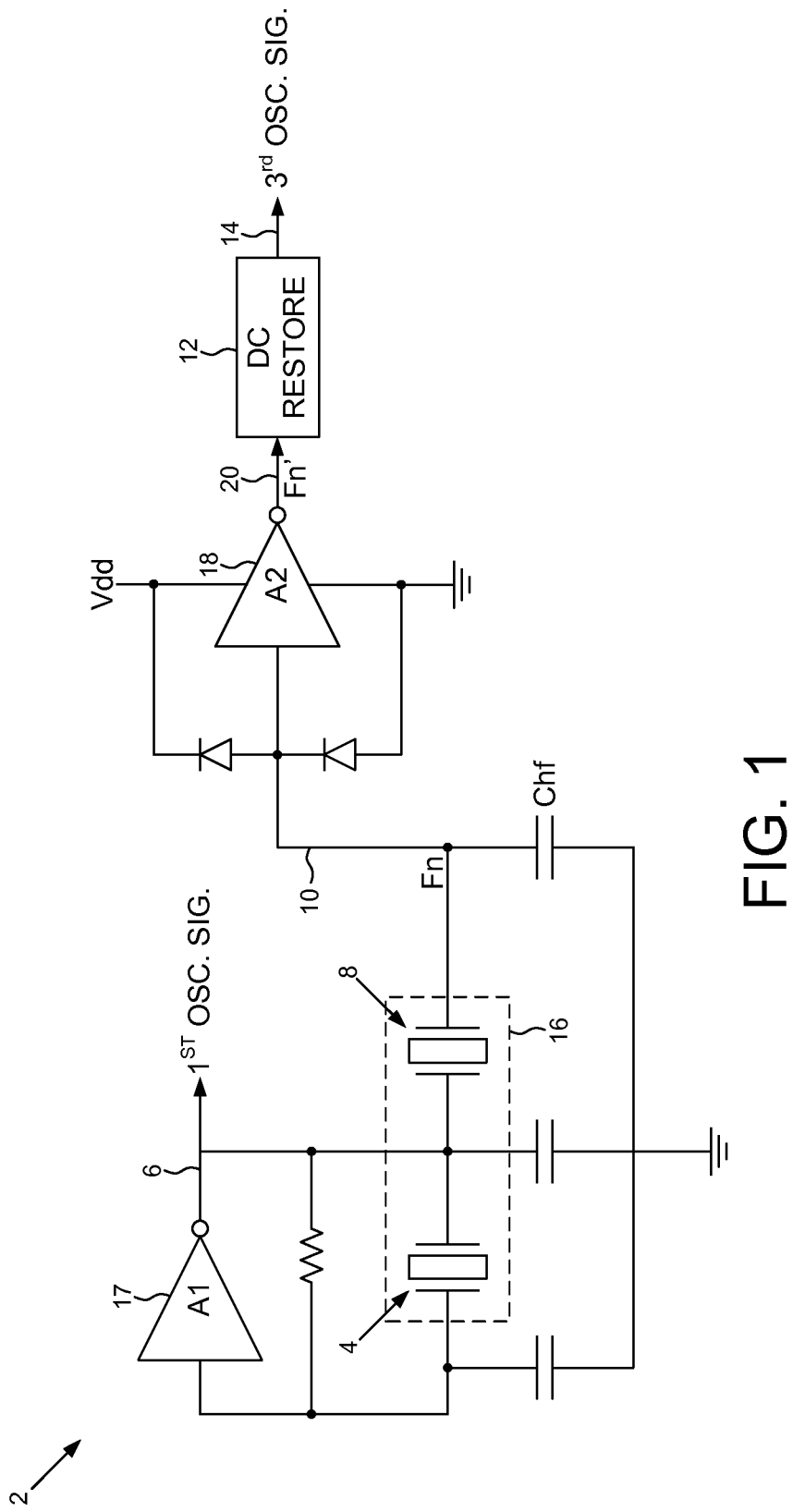
FIG. 1 shows an oscillator according to an embodiment of the present invention comprising a first crystal coupled to a second crystal for generating first and second oscillating signals at different frequencies, and a DC restore circuit operable to generate a third oscillating signal comprising a substantially fifty percent duty cycle in response to the second oscillating signal.

FIG. 1 shows an oscillator 2 according to an embodiment of the present invention comprising a first crystal 4 operable to generate a first oscillating signal 6 at a first frequency, and a second crystal 8 coupled to the first crystal and operable to generate a second oscillating signal 10 at a second frequency higher than the first frequency. The oscillator 2 further comprises a DC restore circuit 12 operable to generate a third oscillating signal 14 comprising a substantially fifty percent duty cycle in response to the second oscillating signal 10.

In one embodiment, the first crystal 4 and the second crystal 8 are fabricated in a single package 16 which may lower the pin count and associated cost. In addition, the first and second crystals 4 and 8 may exhibit similar performance characteristics, as well as a similar response to changing environmental conditions, such as changing temperature, due to the single package 16 fabrication.

In one embodiment, the second crystal 8 comprises a resonant frequency that is significantly higher than a resonant frequency of the first crystal 4, as well as a Q factor that is significantly lower than the first crystal 4. Accordingly in this embodiment the second crystal 8 acts as a bandpass filter (with a very high Q factor) for extracting a harmonic frequency component of the first oscillating signal 6, such as the $2^{nd}$, $3^{rd}$, $4^{th}$, $5^{th}$, or any suitable harmonic of the first oscillating signal 6.

In the embodiment of FIG. 1, the oscillator 2 comprises a first inverting amplifier 17 operable to generate the first oscillating signal 6, and a second inverting amplifier 18 operable to amplify the second oscillating signal 10 to generate an oscillating signal Fn' 20 applied to the DC restore circuit 12. In one embodiment, the first amplifier 17 comprises a first DC offset and the second amplifier 18 comprises a second DC offset different from the first DC offset. As a result, the oscillating signal Fn' 20 will have a DC offset relative to the first oscillating signal 6. In one embodiment, the DC restore circuit 12 compensates for this DC offset in order to generate the third oscillating signal 14 comprising a substantially fifty percent duty cycle.

Figure 2:
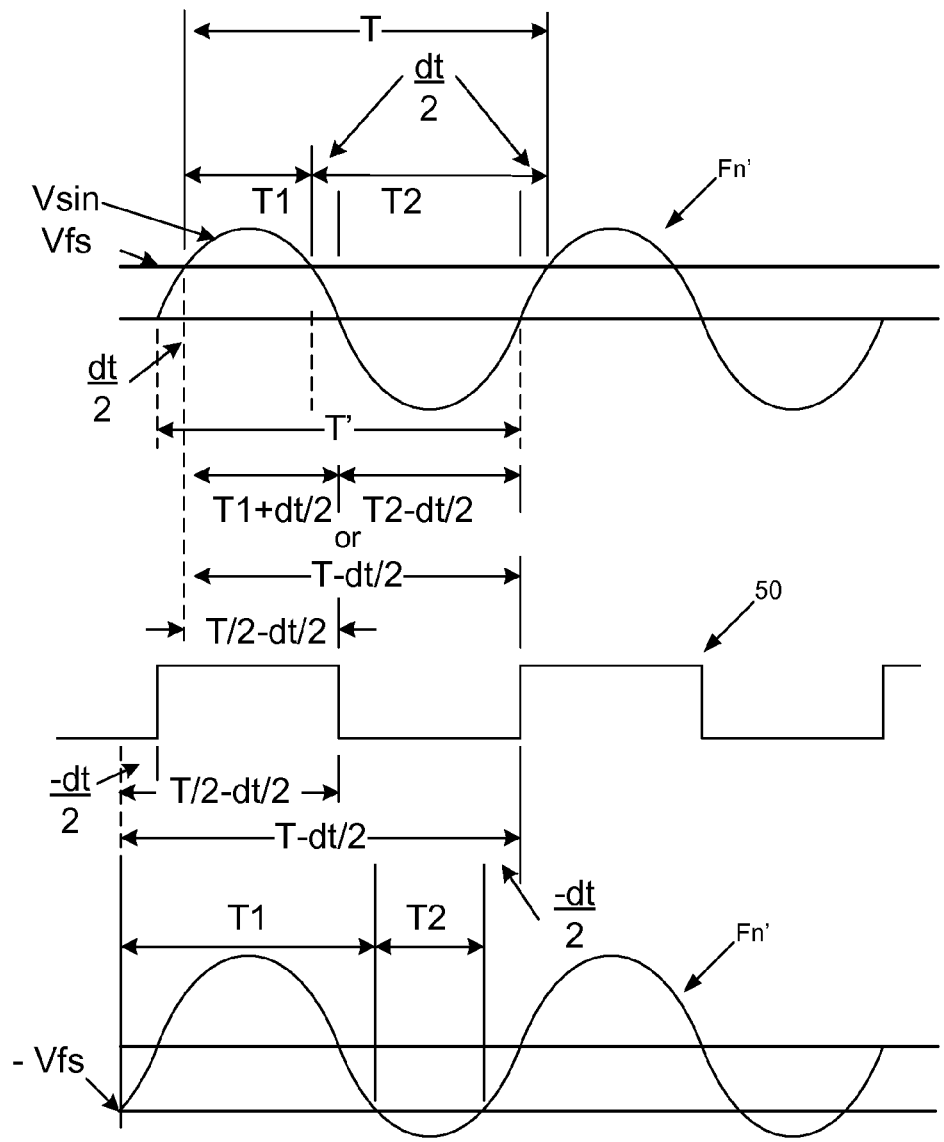
FIG. 2 is a timing diagram that illustrates operation of the DC restore circuit according to an embodiment of the present invention.

FIG. 2 is a timing diagram that illustrates operation of the DC restore circuit 12 according to an embodiment of the present invention. The DC restore circuit 12 comprises a comparator that splits the sine wave of the oscillating signal Fn' 20 into positive (above threshold) and negative (below threshold) components. Counters then measure the positive half cycle (T1) and the negative half cycle (T2). If the DC center point of the sine wave on capacitor Chf differs from the DC bias point of the inverting amplifier 18, these two timings will not be equal. The total difference in timing between the two halves of the waveform (T2−T1) is stored as dt. The output positive edge of the square wave 50 shown in FIG. 2 is therefore advanced by dt/2, and the negative edge is delayed by dt/2. The result is a waveform having a substantially fifty percent duty cycle. The top sine wave shown in FIG. 2 shows the case where the DC offset is negative and therefore dt/2 is positive, and the bottom sine wave shown in FIG. 2 shows the case where the DC offset is positive, and therefore dt/2 is negative.

Figure 3:
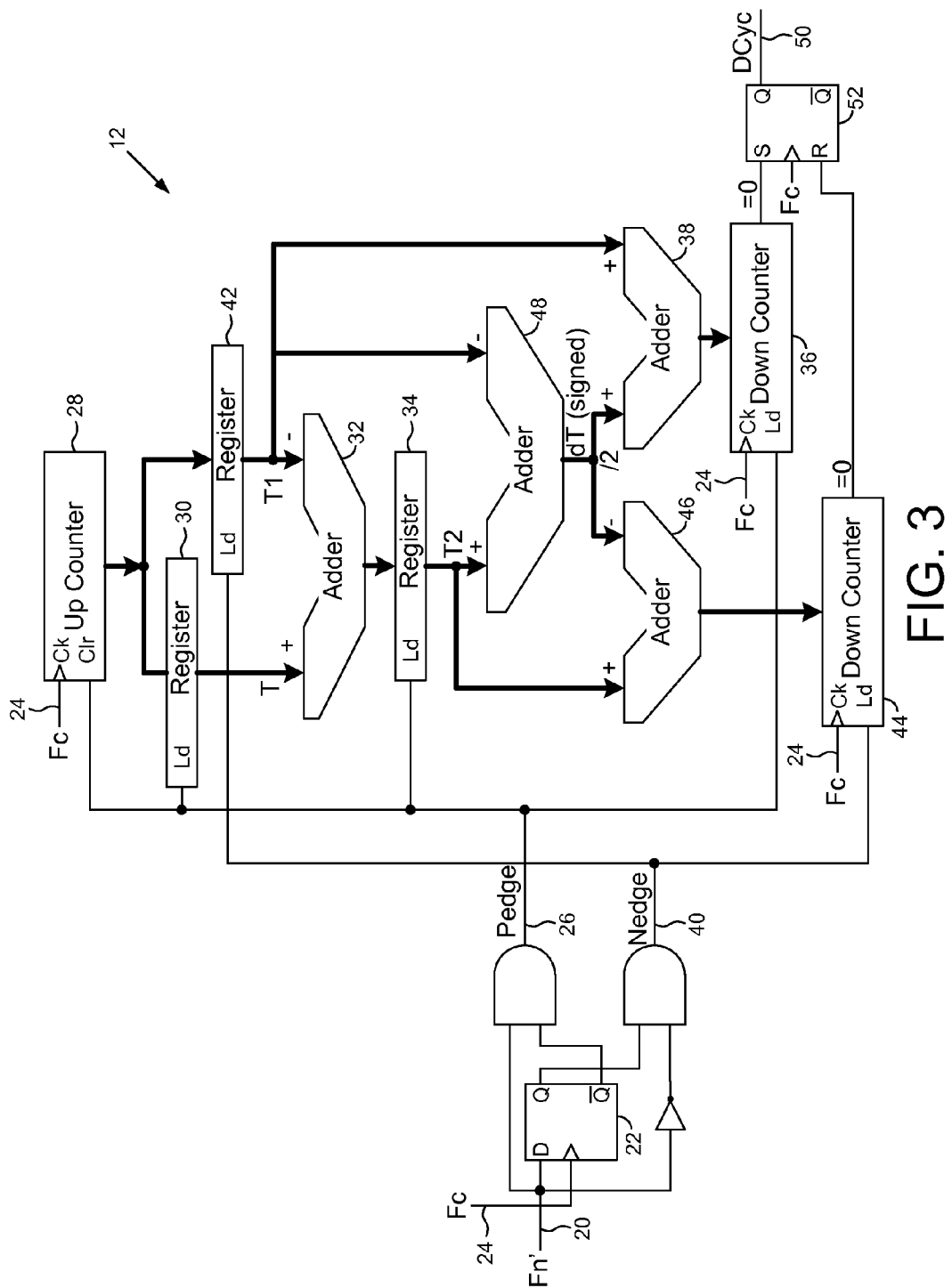
FIG. 3 shows an embodiment of the DC restore circuit according to an embodiment of the present invention.

FIG. 3 shows an embodiment of the DC restore circuit 12 wherein a D-type register 22 is clocked by a fast clock Fc 24 having a frequency significantly higher than the oscillating signal Fn' 20. The threshold of the D-type register 22 corresponds to Vfs in FIG. 2 and establishes the DC offset in the oscillating signal Fn' 20. When the oscillating signal Fn' 20 rises above the threshold, a Pedge signal 26 is active which loads the output of up counter 28 into register 30, loads an output of an adder 32 into register 34, and loads a down counter 36 with the output of an adder 38. The Pedge signal 26 also clears up counter 28. When the oscillating signal Fn' 20 falls below the threshold of the D-type register 22, a Nedge signal 40 is active which loads the output of up counter 28 into register 42, and loads a down counter 44 with the output of an adder 46. Accordingly, register 30 will store T after a full cycle of the oscillating signal Fn' 20, and register 42 will store T1. The output of adder 32 will be (T−T1=T2) which is stored in register 34. The output of adder 48 will be (T2−T1=dt) which is divided by 2 to generate dt/2. The output of adder 46 will be (T2−dt/2), and the output of adder 38 will be (T1+dt/2). The down counter 36 will therefore count the on-time of the square wave 50 shown in FIG. 2, and the down counter 44 will count the off-time of the square wave 50 shown in FIG. 2 via an SR-type register 52. The resulting square wave 50 will have a substantially fifty percent duty cycle after compensating for the DC offset in the oscillating signal Fn' 20.

Figure 4:
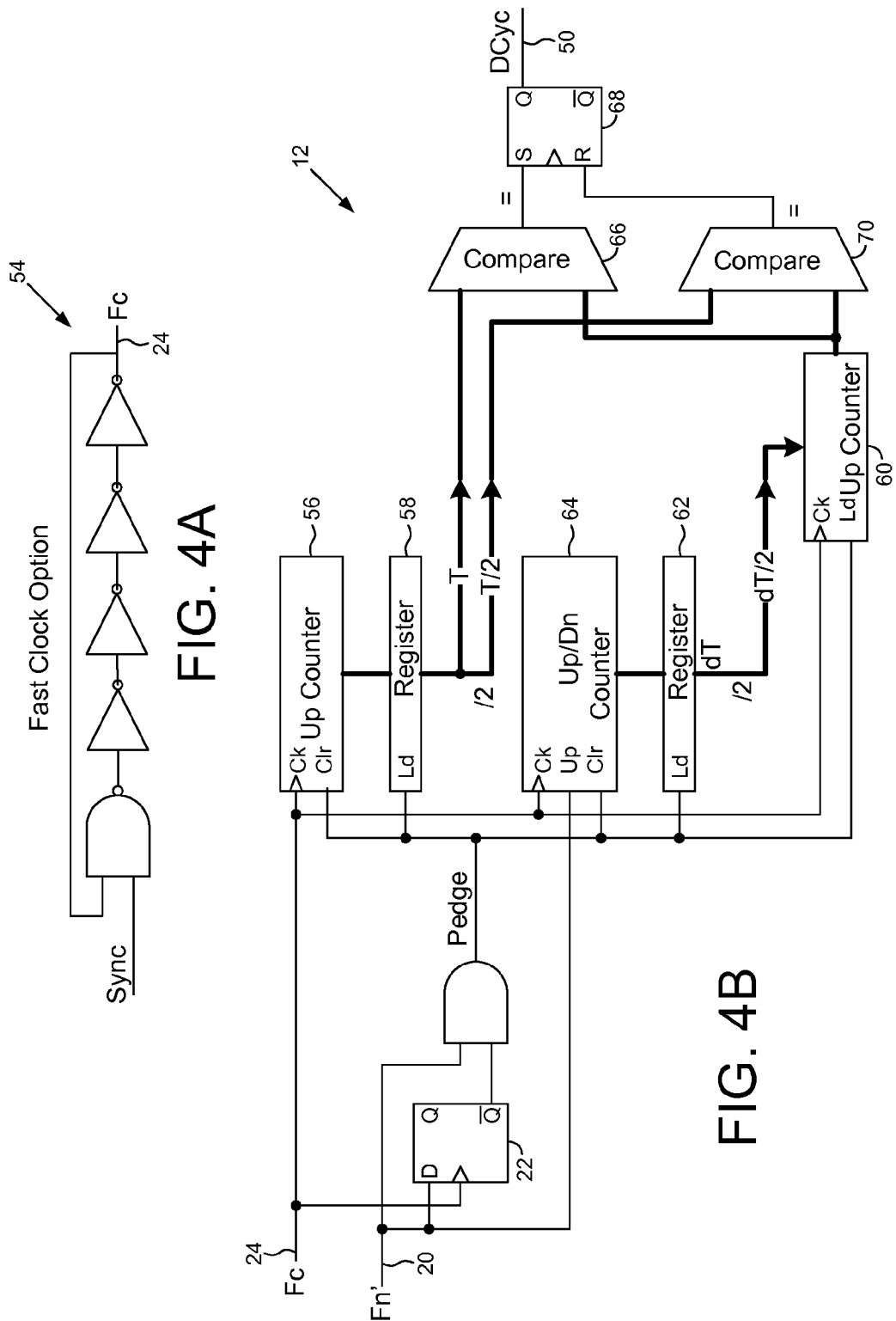
FIG. 4A shows a ring oscillator for generating a fast clock applied to the DC restore circuit according to an embodiment of the present invention.
FIG. 4B shows an embodiment of the DC restore circuit according to an embodiment of the present invention.

FIG. 4A shows an embodiment of the present invention wherein the fast clock 24 applied to the DC restore circuit 12 is generated using a ring oscillator 54. FIG. 4B shows an alternative embodiment for the DC restore circuit 12 that implements the same computations as the embodiment shown in FIG. 3. In this embodiment, the Pedge signal 26 loads the output of an up counter 56 (i.e., T) into a register 58, and loads an up counter 60 with the output of register 62 divided by two (i.e., dt/2). The Pedge signal also clears the up counter 56 and an up/down counter 64 after each cycle of the oscillating signal Fn' 20. The counting direction of the up/down counter 64 is controlled by the polarity of the oscillating signal Fn' 20 such that the output of the up/down counter 64 after a cycle of the oscillating signal Fn' 20 equals dt which is loaded into register 62. A comparator 66 compares the output of register 58 (i.e., T) to the output of up counter 60. When time equals T−dt/2, an SR-type register 68 is set high to time the on-time of the square wave 50. A comparator 70 compares the output of register 58 divided by two (T/2) to the output of up counter 60. When time equals T−T/2 the SR-type register 68 is set low to time the off-time of the square wave 50.

Figure 5:
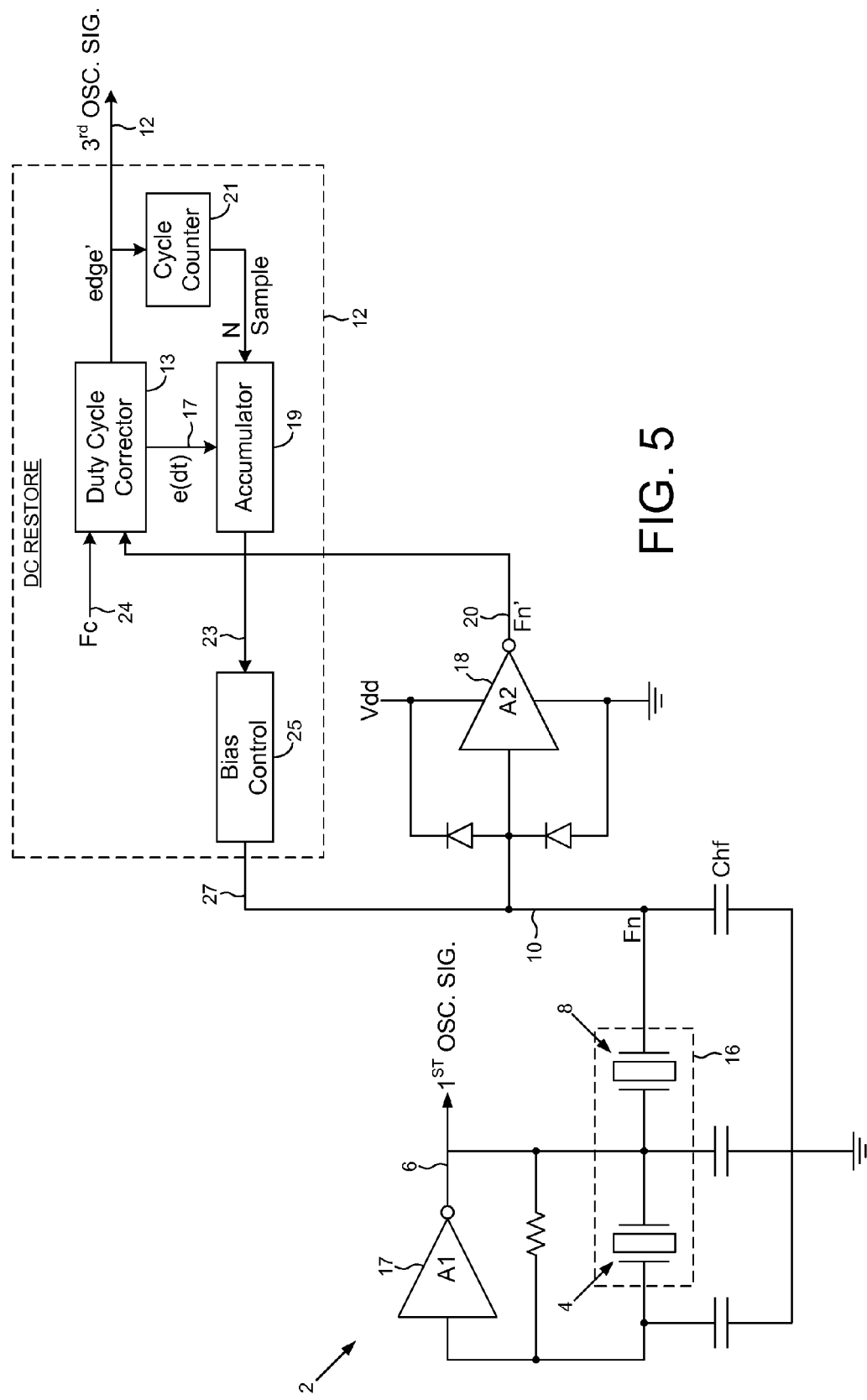
FIG. 5 shows an embodiment of the DC restore circuit according to an embodiment of the present invention.

FIG. 5 shows an embodiment of the DC restore circuit 12 comprising a feedback control system that attempts to maintain the DC offset near zero by injecting a bias signal 27 into the input of amplifier 18. A duty cycle corrector 13 processes the oscillating signal Fn' 20 and a fast clock 24 oscillating at a frequency significantly higher than the oscillating signal Fn' 20 to detect the time delta dt 17 representing the difference in time that the oscillating signal Fn' 20 is above and below the threshold Vfs in FIG. 2. The time delta dt 17 is accumulated 19 over N cycles of the oscillating signal Fn' 20 as counted by a cycle counter 21 to generate an accumulated time delta 23. A bias control 25 processes the accumulated time delta 23 to generate the bias signal 27 that drives the DC offset in the oscillating signal Fn' 20 toward zero.

Figure 6:
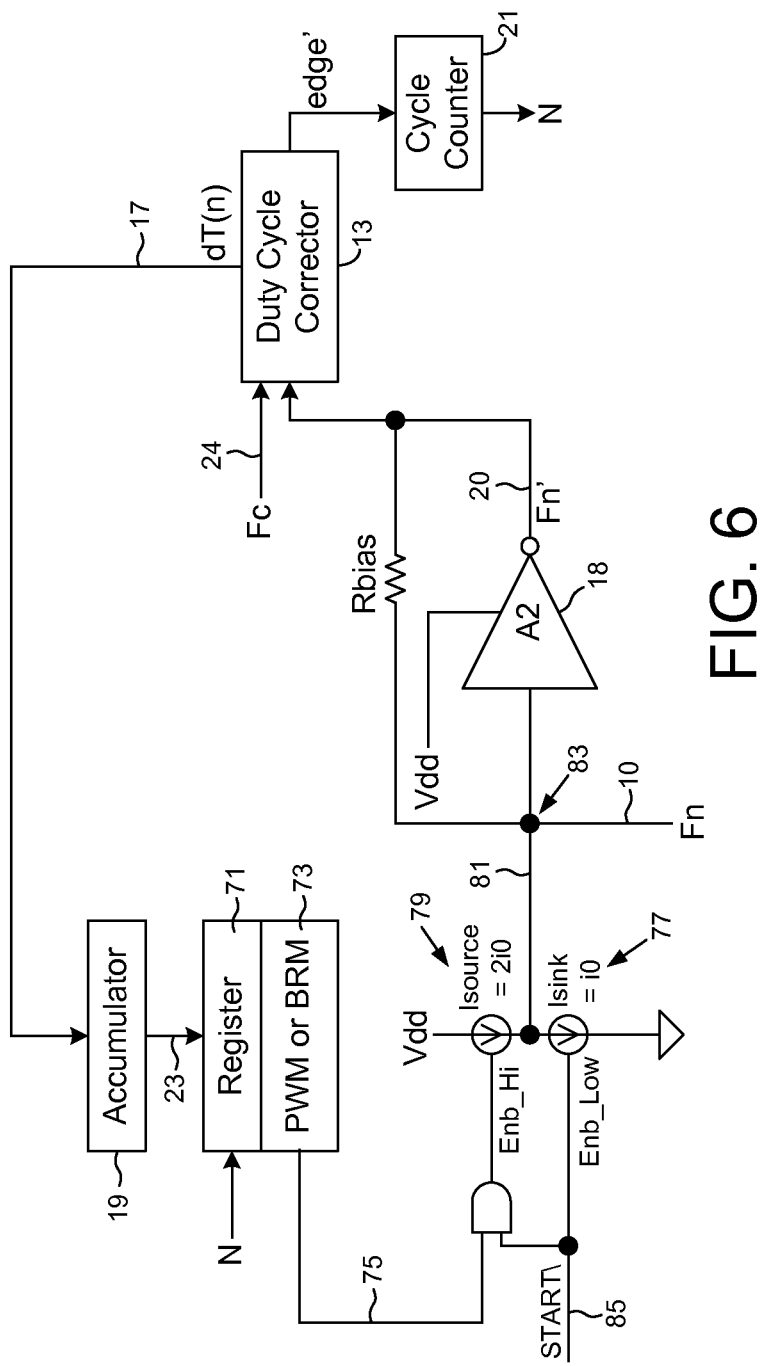
FIG. 6 shows an embodiment of the DC restore circuit according to an embodiment of the present invention.

FIG. 6 shows an embodiment of the DC restore circuit 12 wherein the output of the accumulator 19 is stored in a register 71 after every N cycles of the oscillating signal Fn' 20. The value stored in the register 71 is then converted 73 into a suitable pulse width modulated (PWM) signal or a binary rate multiplier (BRM) signal 75 which drives the bias control 25 in FIG. 5. In the embodiment of FIG. 6, the PWM/BRM signal 75 controls the on/off time of a current source 79 that is coupled to a current sink 77. The end result is to supply an average amount of bias current 81 to node 83 that cancels the DC offset in the oscillating signal Fn' 20 caused by the amplifier 18. In the embodiment of FIG. 6, a START signal 85 disables the DC restore circuit 12 (by disabling the current sink 77 and the current source 79) during a startup operation until the oscillator 2 begins oscillating normally.

Figure 7A:
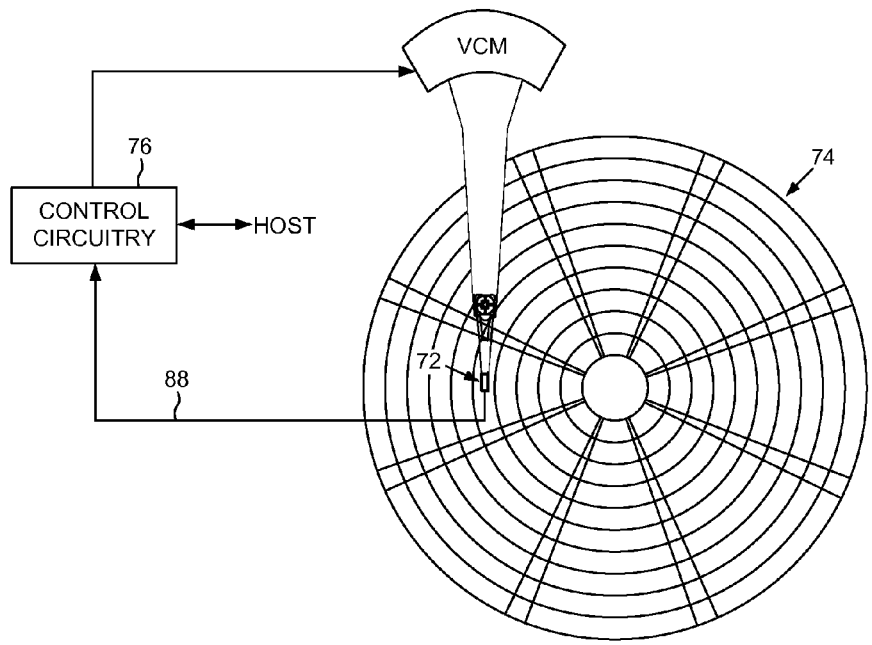
FIG. 7A shows a disk drive comprising control circuitry including the oscillator according to an embodiment of the present invention.
Figure 7B:
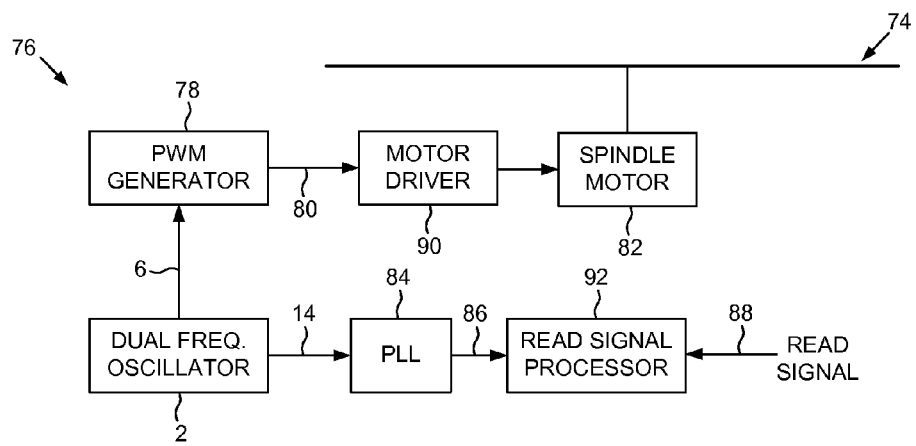
FIG. 7B shows an embodiment of the present invention wherein the first oscillating signal is used by a phase-locked loop (PLL) to generate a system clock, and the second oscillating signal is used to generate a pulse width modulated (PWM) signal for rotating the disk.

FIGS. 7A and 7B show a disk drive according to an embodiment of the present invention comprising a head 72 actuated over a disk 74, and control circuitry 76 comprising a pulse width modulated (PWM) signal generator 78 operable to generate a PWM signal 80, a spindle motor 82 operable to rotate the disk 74 in response to the PWM signal 80, and a phase-locked loop (PLL) 84 operable to generate a system clock 86 used to process a read signal 88 emanating from the head 72. The PWM signal generator 78 is operable to generate the PWM signal 80 based on the first (lower frequency) oscillating signal 6 generated by the oscillator 2, and the PLL 84 is operable to generate the system clock 86 based on the second (higher frequency) oscillating signal 14 output by the oscillator 2.

In the embodiment of FIG. 7B, the control circuitry 76 comprises a suitable motor driver 90 operable to drive windings of the spindle motor 82 in response to the PWM signal 80 using any suitable commutation technique. The embodiment of FIG. 7B also shows a read signal processor 92 for processing the read signal 88 in response to the system clock 86. For example, the read signal processor 92 may comprise suitable sampling circuitry for sampling the read signal 88 based on the system clock 86, and suitable demodulation circuitry for demodulating the read signal samples into an estimated data sequence based on the system clock 86.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

What is claimed is:

1. An oscillator comprising:
  a first crystal operable to generate a first oscillating signal at a first frequency;
  a second crystal coupled to the first crystal and operable to generate a second oscillating signal in response to the first oscillating signal at a second frequency higher than the first frequency; and
  a DC restore circuit operable to generate a third oscillating signal comprising a substantially fifty percent duty cycle in response to the second oscillating signal.

2. The oscillator as recited in claim 1, wherein the first and second crystals are fabricated in a single package.

3. The oscillator as recited in claim 1, further comprising:
  a first amplifier coupled to the first crystal and operable to generate the first oscillating signal; and
  a second amplifier coupled to the second crystal and operable to generate the second oscillating signal,
  wherein the first amplifier comprises a first DC offset and the second amplifier comprises a second DC offset different from the first DC offset.

4. The oscillator as recited in claim 3, wherein the DC restore circuit is operable to compensate for the difference between the first DC offset and the second DC offset.

5. The oscillator as recited in claim 4, wherein the DC restore circuit is operable to compensate for the difference between the first DC offset and the second DC offset by adding a bias signal to an input of the second amplifier.

6. The oscillator as recited in claim 5, wherein the DC restore circuit is operable to:
  first count a number of cycles of a fast clock while the second oscillating signal is above a threshold;
  second count a number of cycles the fast clock while the second oscillating signal is below the threshold; and generate the third oscillating signal based on a difference between the first count and the second count.

7. The oscillator as recited in claim 6, wherein the DC restore circuit is operable to generate the bias signal based on the difference between the first count and the second count.

8. The oscillator as recited in claim 1, wherein the DC restore circuit is operable to:
   first count a number of cycles of a fast clock while the second oscillating signal is above a threshold;
   second count a number of cycles the fast clock while the second oscillating signal is below the threshold; and
   generate the third oscillating signal based on a difference between the first count and the second count.

9. The oscillator as recited in claim 1, wherein the second crystal acts as a bandpass filter for extracting a harmonic frequency component of the first oscillating signal.

10. A disk drive comprising:
    a disk;
    a head actuated over the disk;
    a pulse width modulated (PWM) signal generator operable to generate a PWM signal;
    a spindle motor operable to rotate the disk in response to the PWM signal;
    a phase-locked loop (PLL) operable to generate a system clock used to process a read signal emanating from the head; and
    an oscillator comprising:
        a first crystal operable to generate a first oscillating signal at a first frequency; and
        a second crystal coupled to the first crystal and operable to generate a second oscillating signal at a second frequency higher than the first frequency,
    wherein:
        the PWM signal generator is operable to generate the PWM signal based on the first oscillating signal; and
        the PLL is operable to generate the system clock based on the second oscillating signal.

11. The disk drive as recited in claim 10, wherein the first and second crystals are fabricated in a single package.

12. A method comprising:
    generating a first oscillating signal at a first frequency using a first crystal;
    generating a second oscillating signal in response to the first oscillating signal at a second frequency higher than the first frequency using a second crystal coupled to the first crystal; and
    generating a third oscillating signal comprising a substantially fifty percent duty cycle in response to the second oscillating signal.

13. The method as recited in claim 12, wherein the first and second crystals are fabricated in a single package.

14. The method as recited in claim 13, further comprising:
    generating the first oscillating signal using a first amplifier coupled to the first crystal; and
    generating the second oscillating signal using a second amplifier coupled to the second crystal,
    wherein the first amplifier comprises a first DC offset and the second amplifier comprises a second DC offset different from the first DC offset.

15. The method as recited in claim 14, further comprising generating the third oscillating signal by compensating for the difference between the first DC offset and the second DC offset.

16. The method as recited in claim 15, further comprising compensating for the difference between the first DC offset and the second DC offset by adding a bias signal to an input of the second amplifier.

17. The method as recited in claim 16, further comprising:
    first counting a number of cycles of a fast clock while the second oscillating signal is above a threshold;
    second counting a number of cycles the fast clock while the second oscillating signal is below the threshold; and
    generating the third oscillating signal based on a difference between the first count and the second count.

18. The method as recited in claim 17, further comprising generating the bias signal based on the difference between the first count and the second count.

19. The method as recited in claim 12, further comprising:
    first counting a number of cycles of a fast clock while the second oscillating signal is above a threshold;
    second counting a number of cycles the fast clock while the second oscillating signal is below the threshold; and
    generating the third oscillating signal based on a difference between the first count and the second count.

20. The method as recited in claim 12, wherein the second crystal acts as a bandpass filter for extracting a harmonic frequency component of the first oscillating signal.

21. A method of operating a disk drive, the disk drive comprising a head actuated over a disk, a pulse width modulated (PWM) signal generator operable to generate a PWM signal, a spindle motor operable to rotate the disk in response to the PWM signal, and a phase-locked loop (PLL) operable to generate a system clock used to process a read signal emanating from the head, the method comprising:
    generating a first oscillating signal at a first frequency using a first crystal; and
    generating a second oscillating signal at a second frequency higher than the first frequency using a second crystal coupled to the first crystal,
    wherein:
    the PWM signal generator is operable to generate the PWM signal based on the first oscillating signal; and
    the PLL is operable to generate the system clock based on the second oscillating signal.

22. The method as recited in claim 21, wherein the first and second crystals are fabricated in a single package.

* * * * *